United States Patent
Tsai et al.

(10) Patent No.: US 8,264,070 B2
(45) Date of Patent: Sep. 11, 2012

(54) PACKAGE STRUCTURE WITH ESD AND EMI PREVENTING FUNCTIONS

(75) Inventors: Tsung-Hsien Tsai, Taichung (TW);
Heng-Cheng Chu, Taichung (TW);
Hsin-Lung Chung, Taichung (TW);
Chao-Ya Yang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 57 days.

(21) Appl. No.: 12/914,217

(22) Filed: Oct. 28, 2010

(65) Prior Publication Data
US 2012/0074538 A1   Mar. 29, 2012

(30) Foreign Application Priority Data
Sep. 23, 2010   (TW) ............................... 99132145 A

(51) Int. Cl.
*H01L 23/552* (2006.01)
(52) U.S. Cl. .................. 257/659; 257/59; 257/E23.114; 257/E21.001
(58) Field of Classification Search .................. 257/659, 257/59, E23.114, E21.001
See application file for complete search history.

(56) References Cited

U.S. PATENT DOCUMENTS

| 5,166,772 | A | 11/1992 | Soldner et al. | |
| 6,187,613 | B1 | 2/2001 | Wu et al. | |
| 2004/0231872 | A1* | 11/2004 | Arnold et al. | 174/35 R |
| 2011/0278703 | A1* | 11/2011 | Pagaila et al. | 257/659 |

* cited by examiner

*Primary Examiner* — Long Pham
(74) *Attorney, Agent, or Firm* — Peter F. Corless; Steven M. Jensen; Edwards Wildman Palmer LLP

(57) ABSTRACT

A package structure with ESD (electrostatic discharge) and EMI (electromagnetic interference) preventing functions includes: a carrier having first and second ground structures electrically insulated from one another; a semiconductor component disposed on one surface of the carrier and electrically connected to the first ground structure; and a lid member disposed to cover the carrier and the semiconductor component and electrically connected to the second ground structure. The semiconductor component and the lid member are electrically connected with the first ground structure and the second ground structure, respectively, such that electrostatic charges and electromagnetic waves can be conducted away individually without damaging the semiconductor component, thereby improving yield and reducing the risk of short circuits.

11 Claims, 3 Drawing Sheets

PACKAGE STRUCTURE WITH ESD AND EMI PREVENTING FUNCTIONS

CROSS-REFERENCES TO RELATED APPLICATIONS

This application claims under 35 U.S.C. §119(a) the benefit of Taiwanese Application No. 099132145 filed Sep. 23, 2010, the entire contents of which is incorporated herein by reference.

BACKGROUND OF THE INVENTION

1. Field of the Invention

The present invention relates to package structures, and more particularly, to a package structure with ESD (electrostatic discharge) and EMI (electromagnetic interference) preventing functions.

2. Description of Related Art

Along with the rapid development of science and technology, electronic products are becoming lighter, thinner, shorter and smaller so as to make it easy for consumers to carry and use the products. A method for forming a semiconductor package generally comprises: mounting and electrically connecting a semiconductor chip to a carrier such as a substrate; encapsulating the semiconductor chip and the carrier with an encapsulant such as an epoxy resin so as to protect the semiconductor chip and the carrier against external moisture or pollutants; and covering the encapsulant with a lid member such as a metal shell or, alternatively, covering the semiconductor chip and the carrier with a lid member such as a metal shell, thereby protecting the semiconductor chip from being damaged by external influences, such as ESD, and blocking internal and external EMI and EMC (electromagnetic compatibility).

In such a package, the lid member is electrically connected to a ground structure of the package and further electrically connected to a system ground to thereby conduct away external electromagnetic radiation and electrostatic charges.

FIGS. 1A and 1B show a semiconductor package with a meshed metal shield as disclosed by U.S. Pat. No. 5,166,772. Referring to FIGS. 1A and 1B, a meshed metal shield 12 is disposed on a substrate 10 to cover a chip 11, and an encapsulant 13 encapsulates the metal shield 12 and the chip 11. The metal shield 12 is electrically connected to a ground circuit 14 of the substrate 10 so as to shield EMI generated by the chip 11 or an external device.

FIG. 2 shows another semiconductor package as disclosed by U.S. Pat. No. 6,187,613. Referring to FIG. 2, a chip 11 is mounted to a substrate 10 through a plurality of conductive bumps 15 in a flip-chip manner, a metal foil 16 is attached to the substrate 10 and the chip 11, and an encapsulant 13 is filled between the metal foil 16 and the substrate 10. Therein, the metal foil 16 shields EMI generated by the chip 11 or an external device.

However, since the meshed metal shield or the metal foil is electrically connected to the ground circuit of the chip and active/passive components, when the semiconductor package is disposed on a circuit board, if the meshed metal shield or the metal foil carries electrostatic charges, the electrostatic charges can be conducted along the ground circuit to the circuit board, the chip and the active/passive components. When the electrostatic charges are conducted to the chip and the active/passive components, an electrostatic discharge can occur, thereby easily causing damage of the chip and the active/passive components.

Further, due to too long electrical connecting path from the metal shield or the metal foil to the system ground, especially for a substrate 10 with less than six layers, the grounding effect is adversely affected such that electrostatic charges cannot be released rapidly, thereby easily causing damage of the chip or other active/passive components.

Therefore, it is imperative to provide a package structure so as to protect an internal chip or an active/passive component from being damaged by static electricity and having preferred ESD and EMI preventing functions.

SUMMARY OF THE INVENTION

Accordingly, the present invention provides a package structure with ESD and EMI preventing functions, which comprises: a carrier having a first surface and an opposite second surface and having a first ground structure and a second ground structure electrically insulated from one another; at least a semiconductor component disposed on the first surface of the carrier and electrically connected to the carrier and the first ground structure; and a lid member disposed on the first surface of the carrier for covering the semiconductor component and electrically connected to the second ground structure.

In the above structure, the second ground structure can be disposed around the periphery or at the corners of the carrier. A plurality of conductive members can be disposed on the second surface of the carrier so as to electrically connect to the first ground structure and the second ground structure, respectively.

In a preferred embodiment, the second ground structure comprises conductive through holes penetrating the first and second surfaces of the carrier, and the lid member is disposed on terminals of the conductive through holes on the first surface of the carrier.

Further, the carrier can have an internal circuit.

The semiconductor component can be electrically connected to the internal circuit and the first ground structure of the carrier through wire bonding or in a flip-chip manner. The semiconductor component can be an active component, a passive component or a combination thereof. Therein, the passive component can be a capacitor, a resistor or an inductor.

A plurality of dummy pads can be disposed on the second surface of the carrier, and the second ground structure can be electrically connected to the dummy pads. The dummy pads can be disposed at positions other than the periphery or the corners of the carrier.

The above-described package structure can further comprise an encapsulant encapsulating the semiconductor component, wherein the lid member is disposed on the encapsulant.

The package structure can further comprise an encapsulant encapsulating the lid member.

Therefore, the package structure of the present invention has a carrier with a first ground structure and a second ground structure electrically insulated from one another, a semiconductor component being electrically connected to the first ground structure of the carrier and the lid member being electrically connected to the second ground structure of the carrier. As such, when the package structure is disposed on a circuit board, if the lid member carries electrostatic charges, the electrostatic charges can be directly conducted through the second ground structure to the circuit board without passing through the first ground structure, thereby protecting the semiconductor component from being adversely affected and even damaged by an electrostatic discharge. Furthermore, the lid member blocks external electromagnetic wave or radio frequency interferences and releases charges through the second ground structure so as to protect the semiconductor component against interferences.

BRIEF DESCRIPTION OF DRAWINGS

FIG. 4B' is a cross-sectional view of a package structure with the carrier of FIG. 4B.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 1A:
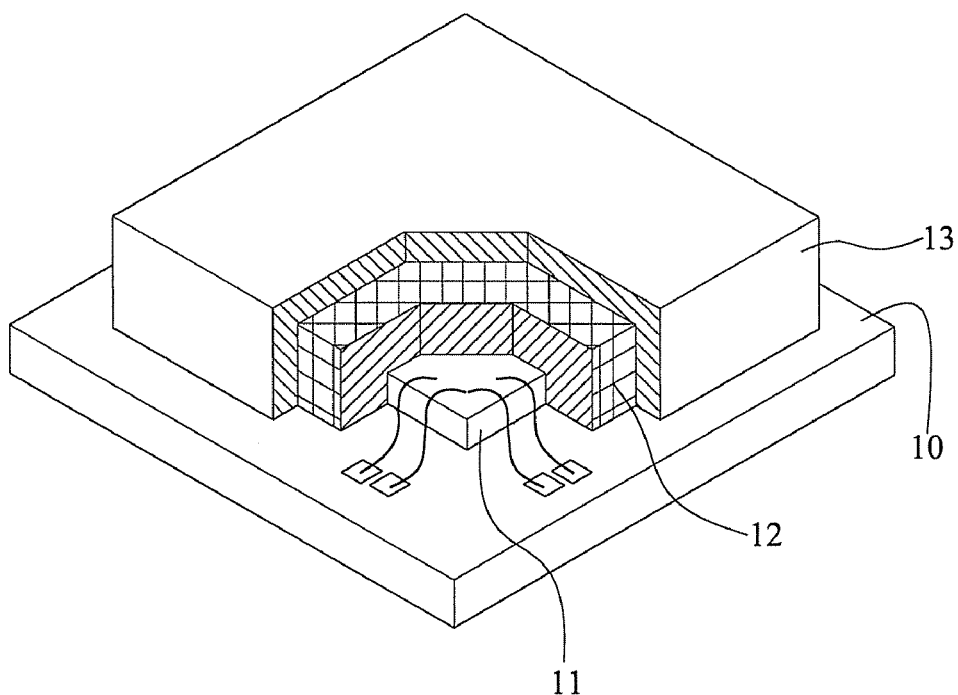
FIGS. 1A and 1B are a cutaway view and a cross-sectional view, respectively, of a semiconductor package disclosed by U.S. Pat. No. 5,166,772.
Figure 1B:
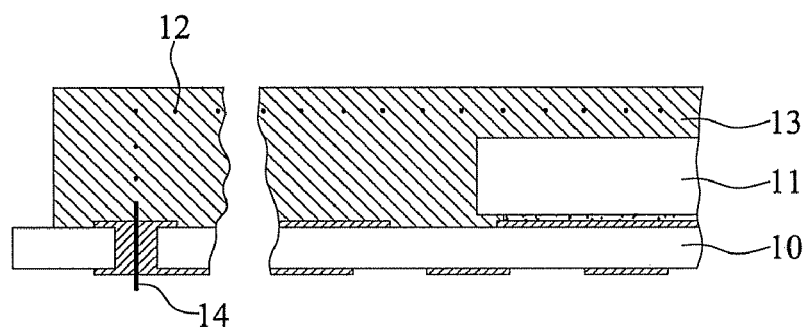
Figure 2:
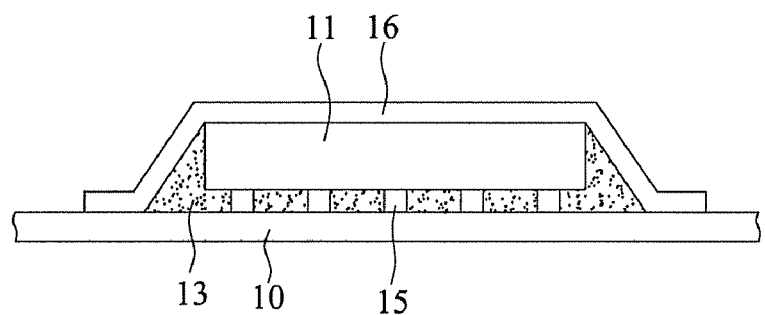
FIG. 2 is a cross-sectional view of a semiconductor package disclosed by U.S. Pat. No. 6,187,613.
Figure 3A:
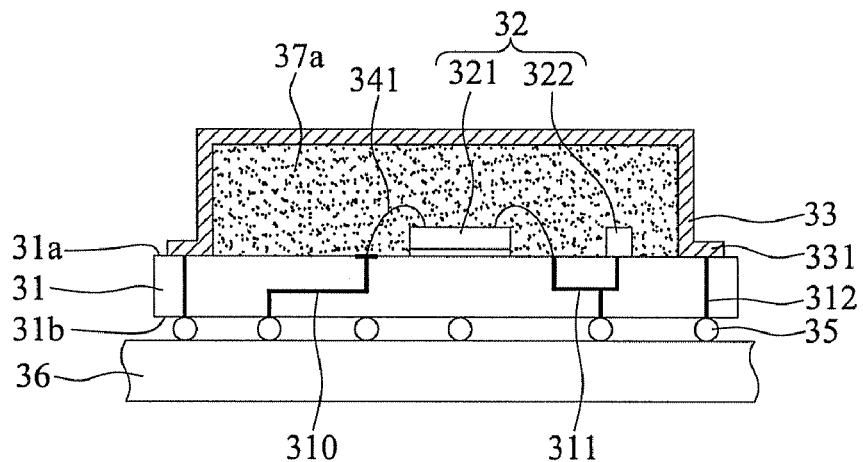
FIGS. 3A to 3C are cross-sectional views of a package structure with ESD and EMI preventing functions according to different embodiments of the present invention.
Figure 3B:
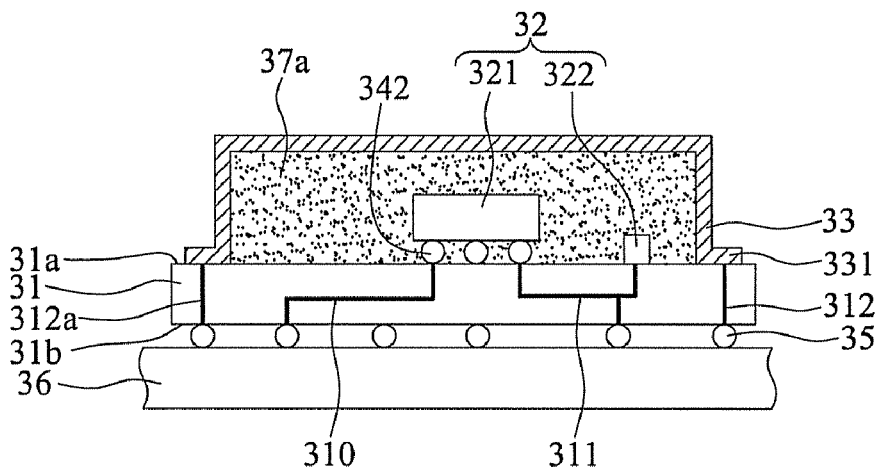
Figure 3C:
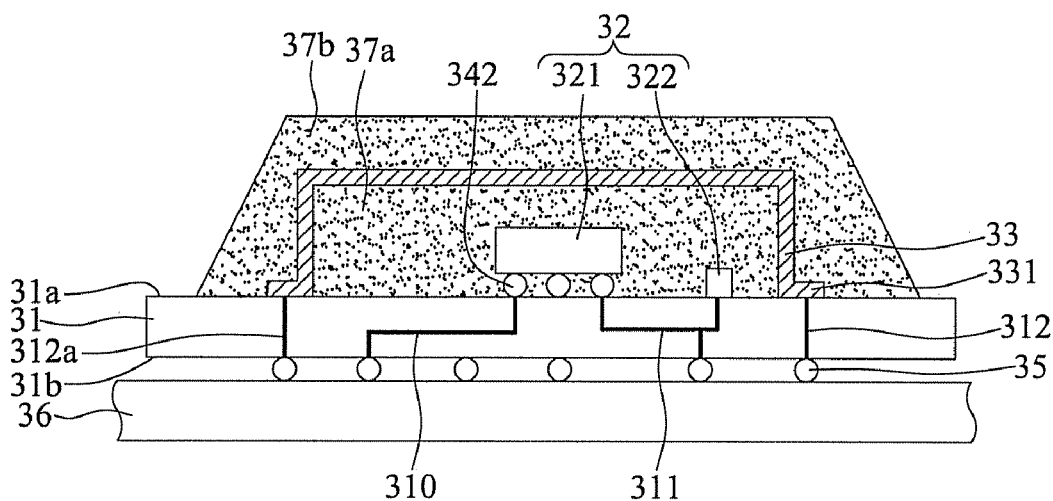

FIGS. 3A to 3C are cross-sectional views of a package structure with ESD and EMI preventing functions according to different embodiments of the present invention.

Referring to the drawings, the package structure comprises a carrier 31, at least a semiconductor component 32 disposed on the carrier 31 and a lid member 33 covering the semiconductor component 32.

The carrier 31 can be such as a BGA substrate or an LGA substrate. The carrier 31 has a first surface 31a and an opposite second surface 31b. Further, the carrier 31 comprises an internal circuit 310 (containing signal circuit portions and power circuit portions), and a first ground structure 311 and a second ground structure 312, wherein the first and second ground structures 311, 312 are electrically insulated from one another.

The semiconductor component 32 can be an active component such as a chip 321, a passive component 322 such as a capacitor, a resistor or an inductor, or a combination thereof. The semiconductor component 32 is disposed on the first surface 31a of the carrier 31 and electrically connected to the internal circuit 310 and the first ground structure 311 of the carrier 31 through conductive wires 341 (as shown in FIG. 3A) by wire bonding or through conductive bumps 342 (as shown in FIG. 3B) in a flip-chip manner.

The lid member 33 is disposed on the first surface 31a of the carrier 31 so as to cover the semiconductor component 32 and electrically connect to the second ground structure 312.

To fabricate the above-described package structure, a molding process is performed first to form an encapsulant 37a encapsulating the semiconductor component 32, and then a sputtering process is performed to form a metal layer on the encapsulant 37a, thereby forming a lid member 33 (as shown in FIGS. 3A and 3B). Alternatively, a pre-formed lid member 33 is disposed on the carrier 31 and then a molding process is performed to form an encapsulant 37b encapsulating the lid member 33 (as shown in FIG. 3C).

Preferably, the second ground structure 312 comprises conductive through holes 312a penetrating the first surface 31a and the second surface 31b of the carrier 31 so as to shorten the electrical conductive path. The lid member 33 is disposed on terminals of the conductive through holes 312a on the first surface 31a of the carrier 31.

Further, a plurality of conductive members 35, such as solder balls, solder pins or solder pads, are mounted on the second surface 31b of the carrier for electrically connecting to the internal circuit 310, the first ground structure 311 and the second ground structure 312, respectively. Thereafter, the package structure is disposed on a circuit board 36 so as to allow signals or power of the semiconductor component 32 to be conducted through the internal circuit 310 and the conductive members 35. Therein, the first ground structure 311 is electrically connected to the ground structure (not shown) of the circuit board 36. The lid member 33 is electrically connected to the circuit board 36 through the second ground structure 312 and the corresponding conductive members 35.

The conductive members 35 corresponding to the second ground structure 312 are directly disposed below the second ground structure 312 and the second ground structure 312 is directly disposed below the lid member 33, thus shortening the electrical conductive path and accelerating the rate of charge release.

As described above, the semiconductor component 32 is electrically connected to the first ground structure 311 of the carrier 31 and the lid member 33 is electrically connected to the second ground structure 312 of the carrier 31. Thus, when the package structure is disposed on the circuit board 36, if the lid member 33 carries electrostatic charges, the electrostatic charges can be directly conducted through the second ground structure 312 to the circuit board 36 without passing through the first ground structure 311, thereby protecting the semiconductor component 32 from being adversely affected and even damaged by the electrostatic charges.

Further, the lid member 33 blocks external EMI and EMC and releases charges through the second ground structure 312 so as to protect the semiconductor component 32 against interferences. Internal electrostatic charges, electromagnetic wave or radio frequency interferences of the semiconductor component 32 can be individually released through the first ground structure 311, thus achieving protection of the semiconductor component 32.

Figure 4A:
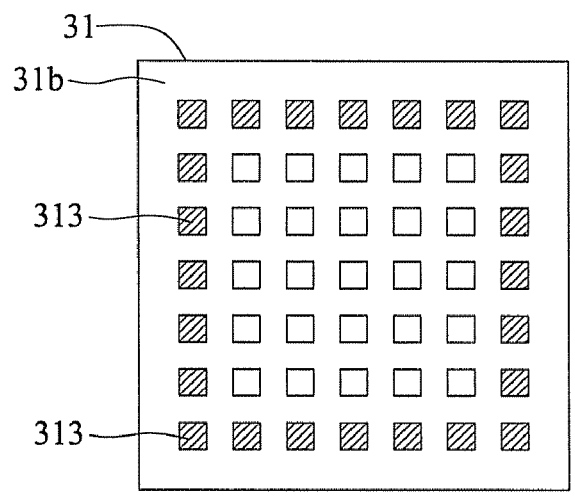
FIGS. 4A and 4B are bottom views of a carrier of a package structure with ESD and EMI preventing functions according to different embodiments of the present invention.
Figure 4B:
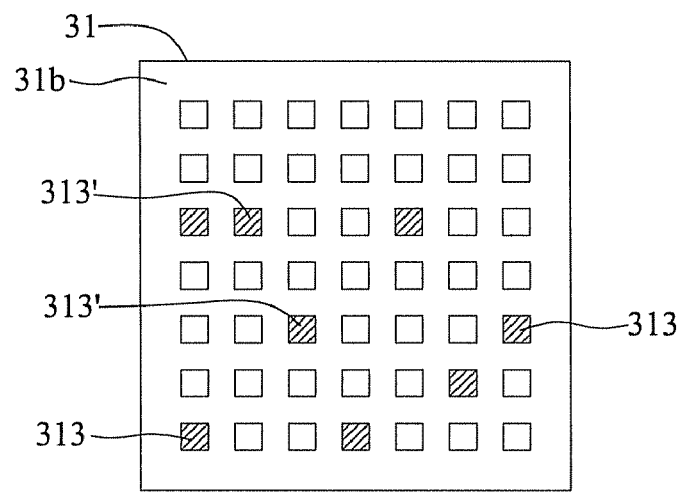
Figure 4B:
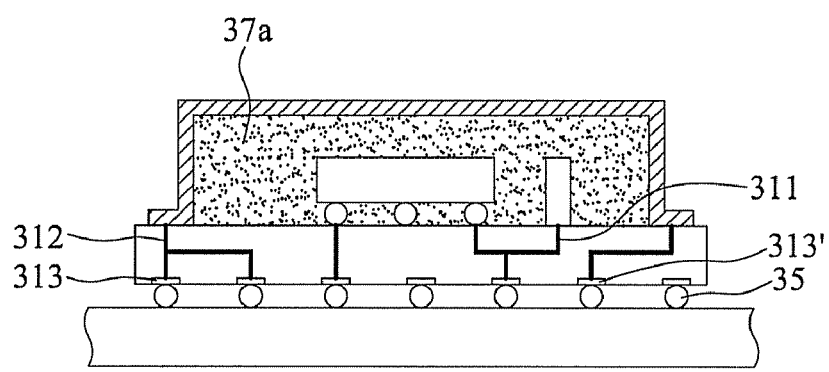

FIGS. 4A and 4B are bottom views of the carrier 31 according to different embodiments of the present invention. Referring to FIG. 4A, a plurality of solder pads 313 are disposed around the periphery or at the four corners of the second surface 31b of the carrier 31 for electrically connecting to the second ground structure 312. Correspondingly, the lid member 33 has contact portions 331 (as shown in FIGS. 3A to 3C) extending to the periphery or the four corners of the carrier 31 for electrically connecting to the second ground structure 312 and the solder pads 313. In practice, the second ground structure 312 can be conductive through holes 312a disposed around the periphery or at the four corners of the carrier 31. Similarly, the conductive members 35 electrically connecting to the second ground structure 312 are correspondingly disposed on the solder pads 313 around the periphery or at the four corners on the second surface 31b of the carrier 31.

In another embodiment shown in FIGS. 4B and 4B', a plurality of solder pads 313' electrically connecting to the second ground structure 312 are disposed at positions other than the periphery or the four corners of the second surface 31b of the carrier 31, for example, the solder pads 313' can be disposed at an inner region on the second surface 31b of the carrier 31. Further, the solder pads 313' can be dummy pads as long as the first ground structure 311 and the second ground structure 312 are separated and electrically insulated from one another.

Therefore, the package structure of the present invention has a carrier with a first ground structure and a second ground structure electrically insulated from one another, a semiconductor component being electrically connected to the first ground structure of the carrier and the lid member being electrically connected to the second ground structure of the carrier. As such, when the package structure is disposed on a circuit board, if the lid member carries electrostatic charges, the electrostatic charges can be directly conducted through the second ground structure to the circuit board without passing through the first ground structure, thereby protecting the semiconductor component from being adversely affected and even damaged by an electrostatic discharge. Furthermore, the lid member blocks external electromagnetic wave or radio frequency interferences and releases charges through the second ground structure so as to protect the semiconductor component against interferences.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A package structure with ESD (electrostatic discharge) and EMI (electromagnetic interference) preventing functions, comprising:
   a carrier having a first surface and an opposite second surface and having a first ground structure and a second ground structure electrically insulated from one another;
   at least a semiconductor component disposed on the first surface of the carrier and electrically connected to the carrier and the first ground structure;
   an encapsulant formed on the first surface of the carrier for encapsulating the semiconductor component; and
   a lid member disposed on the encapsulant for covering the semiconductor component and electrically connected to the second ground structure.

2. The package structure of claim 1, wherein the second ground structure is disposed around periphery or at corners of the carrier.

3. The package structure of claim 2, wherein a plurality of conductive members are disposed on the second surface of the carrier so as to electrically connect to the first ground structure and the second ground structure, respectively.

4. The package structure of claim 2, wherein the second ground structure comprises conductive through holes penetrating the first and second surfaces of the carrier, and the lid member is disposed on terminals of the conductive through holes on the first surface of the carrier.

5. The package structure of claim 1, wherein the carrier further has an internal circuit.

6. The package structure of claim 5, wherein the at least a semiconductor component is electrically connected to the internal circuit and the first ground structure of the carrier through wire bonding or in a flip-chip manner.

7. The package structure of claim 1, wherein the semiconductor component is an active component, a passive component or a combination thereof.

8. The package structure of claim 7, wherein the passive component is a capacitor, a resistor or an inductor.

9. The package structure of claim 1, wherein a plurality of dummy pads are disposed on the second surface of the carrier, and the second ground structure is electrically connected to the dummy pads.

10. The package structure of claim 9, wherein the dummy pads are disposed at positions other than periphery or corners of the carrier.

11. The package structure of claim 1, wherein the encapsulant encapsulates the lid member.

* * * * *